United States Patent [19]
Nakamura

[11] Patent Number: 5,138,639
[45] Date of Patent: Aug. 11, 1992

[54] PULSE POSITION MEASUREMENT TYPE METER-DRIVING CIRCUIT CAPABLE OF IMPROVING MEASUREMENT ACCURACY

[75] Inventor: Yoshihito Nakamura, Yokohama, Japan

[73] Assignee: Kabushiki Kaisha Toshiba, Kawasaki, Japan

[21] Appl. No.: 721,895

[22] Filed: Jun. 27, 1991

[30] Foreign Application Priority Data

Jun. 28, 1990 [JP] Japan .................. 2-171214

[51] Int. Cl.⁵ ............................................. G01R 11/36
[52] U.S. Cl. ........................................ 377/17; 377/20; 324/166; 324/168
[58] Field of Search ............... 377/17, 20; 324/166, 324/168

[56] References Cited

U.S. PATENT DOCUMENTS

| | | | |
|---|---|---|---|
| 4,085,890 | 4/1978 | Kimura et al. | 377/17 |
| 4,506,216 | 3/1985 | Fukamachi et al. | 324/166 |
| 4,881,248 | 11/1989 | Korechika | 377/17 |
| 4,931,966 | 6/1990 | Ishizaka | 324/166 |
| 5,003,257 | 3/1991 | Okura et al. | 324/166 |
| 5,017,861 | 5/1991 | Hukuda | 324/166 |

Primary Examiner—Stanley D. Miller
Assistant Examiner—Scott A. Ouellette
Attorney, Agent, or Firm—Finnegan, Henderson, Farabow, Garrett and Dunner

[57] ABSTRACT

A pulse control circuit generates latch signals in response to edges of externally-input pulses and generates a resetting signal after each of the latch signals is generated. A pulse position measurement counter counts reference clock signals, thereby measuring the time interval between the generation of one latch signal and the generation of the succeeding latch signal. In response to the latch signal, a latch circuit latches the time interval measured by the pulse position measurement counter as output data. A pulse detector detects that the time interval between successive latch signals is shorter than a predetermined time. It also detects that the number of latch signals which have been input is larger than a predetermined number. A data control circuit is employed in association with the pulse detector. The data control circuit supplies a control signal to the pulse control circuit after the lapse of a predetermined time from the detection performed by the pulse detector, thereby interrupting a counting operation performed by the pulse position measurement counter before detection of a next latch signal.

7 Claims, 4 Drawing Sheets

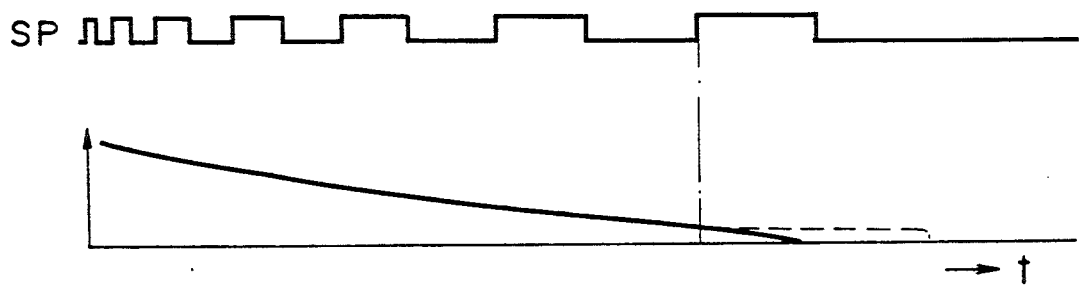
F I G. 6

PULSE POSITION MEASUREMENT TYPE METER-DRIVING CIRCUIT CAPABLE OF IMPROVING MEASUREMENT ACCURACY

BACKGROUND OF THE INVENTION

1. Field of the Invention

The present invention relates to a pulse position measurement type meter-driving circuit which measures the distance between the edges of externally-input successive pulses and which controls the display of the meter or the position of the indicating needle thereof in accordance with the distance between the pulse edges. In particular, the meter-driving circuit is advantageously applied to the processing of output data in the case where the distance between the pulse edges varies greatly.

2. Description of the Related Art

A pulse position measurement type meter-driving circuit measures the distance between the edges of externally-input successive pulses and executes processing in accordance with the measurement. The operation of this circuit will be described, with reference to the timing chart shown in FIG. 1. As is understood from the timing chart, a pulse control circuit generates a latch signal EG and a resetting signal ER in response to edges of input pulses IN. A binary counter measure the time corresponding to the distance between the edges of two successive input pulses IN, by counting reference clock pulses supplied thereto. After the count is reset by the resetting signal ER, the binary counter measures the time corresponding to the distance between the edges of the next two successive input pulses IN. The time measured by the binary counter is output as measurement data DAT, each time the count of the binary counter is reset.

When the time interval between two successive latch signals EG is being counted up by the binary counter, measurement data DAT corresponding to the time interval between the preceding two successive latch signals EG is continuously output. In other words, measurement data DAT is determined after one edge (rise) of the input pulse IN is detected and when the next edge thereof has just been detected. For example, data regarding time T1 corresponding to the distance between the edges of two successive input pulses IN is continuously output during time T2 corresponding to the distance between the edges of the next two successive input pulses IN. In accordance with the data, the display of the meter or the position of the indicating needle thereof is determined.

There may be a case where no pulse edge corresponding to the end of the measurement is entered after the detection of a pulse edge corresponding the start of measurement. Also, there may be a case where the time interval between the two successive pulse edges is far longer than the time interval between the preceding two successive pulse edges. In such cases, the output of the measurement data corresponding to the preceding edge-to-edge distance is continued even after the detection of the pulse edge corresponding to the start of the measurement. In other words, the output measurement data does not always reflect the actual measurement.

SUMMARY OF THE INVENTION

Accordingly, an object of the present invention is to provide a pulse position measurement type meter-driving apparatus which ensures a reliable metering operation even if the input pulse signal varies greatly or is discontinuous.

To achieve this object, the present invention provides a pulse position measurement type meter-driving apparatus, comprising:

pulse position measurement means for generating both a latch signal and a resetting signal in response to edges of externally-input pulses and repeatedly measuring time corresponding to the distance between the edges of two successive pulses;

pulse-detecting means for detecting that the pulses have a width corresponding to time shorter than a predetermined time and that the number of pulses input exceeds a predetermined number;

interruption control means for generating an interruption latch signal after the lapse of a predetermined time from the detection performed by the pulse-detecting means and when the pulse position measurement means which has not yet received a next pulse is operating; and data control means for repeatedly outputting measurement data with which to control display of a meter, in accordance with a time interval between the generation of the latch signal from the pulse position measurement means the generation of the interruption latch signal from the interruption control means and in accordance with the time measured by the pulse position measurement means.

According to the present invention, a rapid decrease in the number pulses included in an input signal is detected, and after the lapse of a predetermined time from that detection, an interruption latch signal is output. On the basis of the interruption latch signal, data can be smoothly decreased before a pulse edge is detected next time, thereby solving the problem entailed in the conventional apparatus mentioned above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a timing chart showing an advantage obtained when the present invention is applied to the indicating needle control of the speedometer of an automobile.

DETAILED DESCRIPTION OF THE PREFERRED EMBODIMENTS

Embodiments of the present invention will now be described, with reference to the accompanying drawings.

Figure 2:
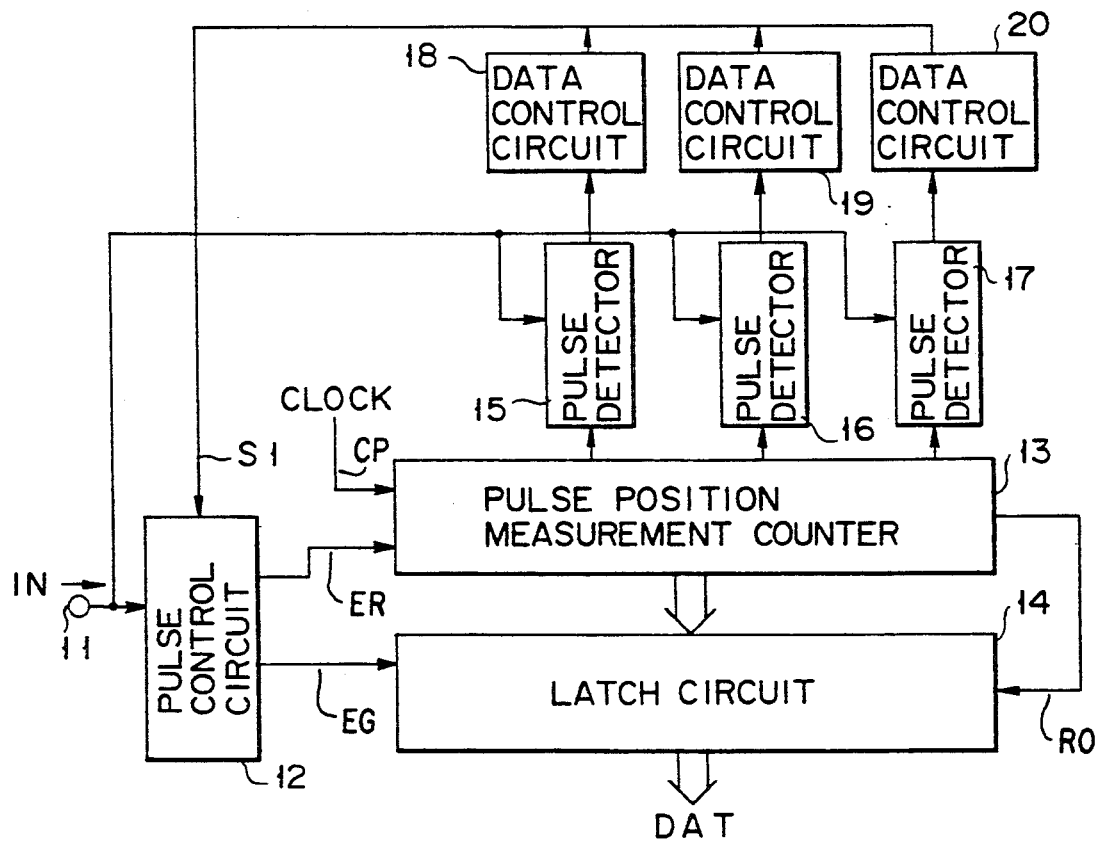
FIG. 2 is a diagram showing the circuit according to one embodiment of the present invention.

FIG. 2 shows the circuit configuration of a pulse position measurement type meter-driving apparatus according to the first embodiment of the present invention. Input pulses IN are received by a terminal 11 and are supplied to a pulse control circuit 12. A pulse control circuit 12 generates both a latch signal EG and a resetting signal ER in response to edges of the input pulses IN. A pulse position measurement counter 13 measures the time corresponding to the distance between the edges of two successive pulses IN, by counting clock pulses CP supplied thereto. After the count is reset by the resetting signal ER, the pulse position measurement counter 13 measures the time corresponding to the distance between the edges of the next two successive pulses IN. If the counter 13 overflows, a resetting signal RO is supplied to a latch circuit 14. The output of measurement data DAT which represents the time corresponding to the distance between the edges of the preceding two successive input pulses IN is continued until either the latch signal EG or the resetting signal RO is supplied to the latch circuit 14.

Pulse detectors 15, 16 and 17 are connected to the pulse position measurement counter 13. Each pulse detector comprises a timer. Time T1 is set for the timer of pulse detector 15, time T2 for the timer of pulse detector 16, and time T3 for the timer of pulse detector 17. Each pulse detector checks input pulses IN whose pulse widths correspond to time shorter than time Tn (i.e., time T1, time T2, or time T3), and detects whether or not the number of such pulses is larger than a predetermined number N. Data control circuits 18, 19 and 20 are connected to pulse detectors 15, 16 and 17, respectively. If the number of input pulses IN whose pulse widths correspond to time shorter than time Tn is larger than the predetermined number N, and if the time before the input of another pulse is longer than time Tn, then the data control circuits 18–20 supply a control signal to the pulse control circuit 12 to output the latch signal EG from the pulse control circuit 12 to the latch circuit 14.

In the above circuit configuration, the pulse detectors 15–17 and the data control circuits 18–20 permit a latch signal EG to be supplied to the latch circuit 14 in the following two cases: a case where no pulse edge corresponding to the end of measurement is entered after the detection of a pulse edge corresponding the start of measurement; and a case where the time interval between the two successive pulse edges becomes far longer than the time interval between the preceding two successive pulse edges. Due to the supply of the latch signal EG to the latch circuit 14, the output of the measurement data corresponding to the time interval between the previous pulse edges is stopped, and new measurement data is output instead.

Figure 3:
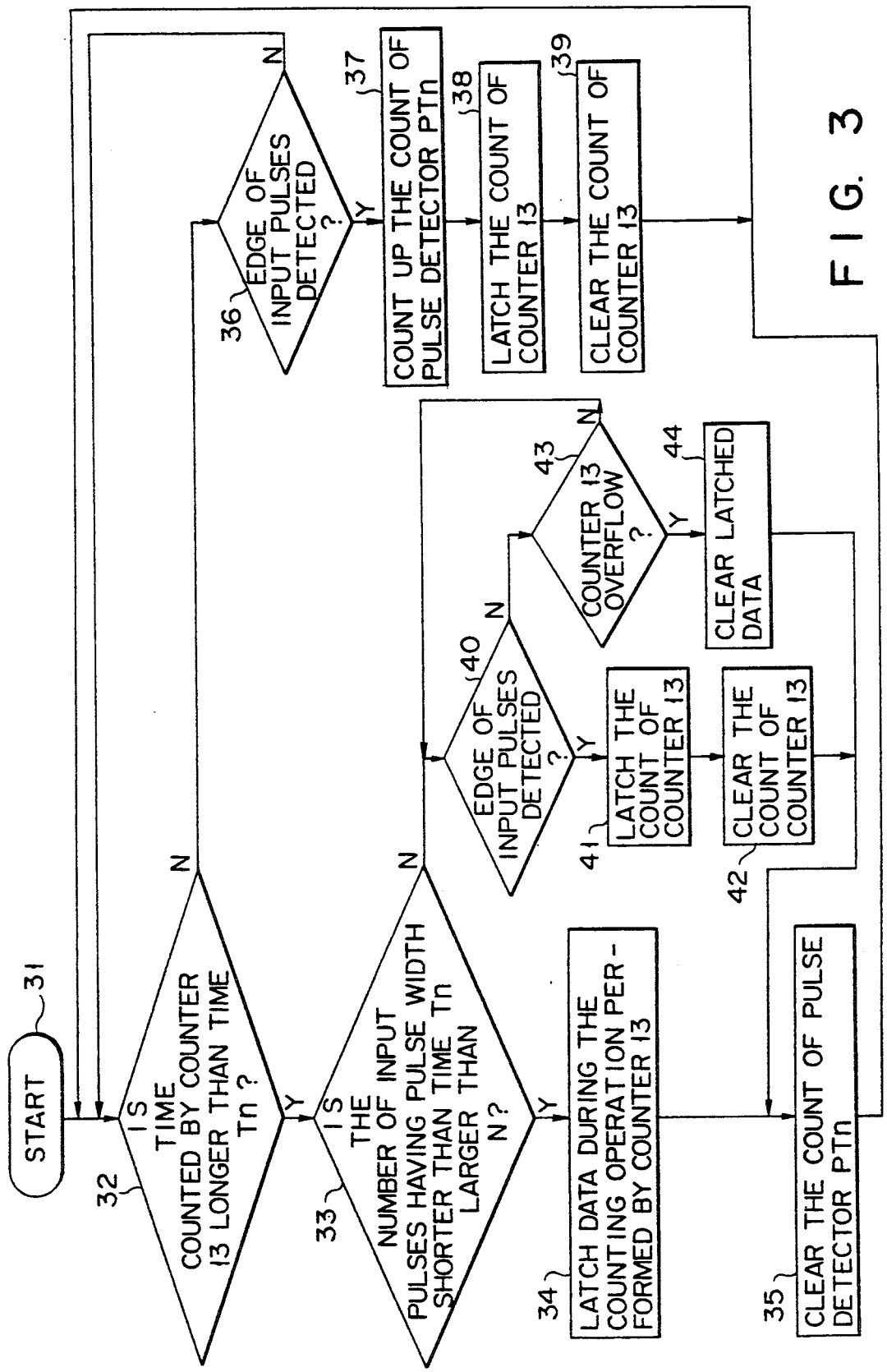
FIG. 3 is a flowchart showing how a data control operation is performed by the circuit shown in FIG. 2.

FIG. 3 is a flowchart showing how the circuit in FIG. 2 performs a data control operation. In the circuit shown in FIG. 2, three pulse detectors 15–17 are depicted. However, the number of pulse detectors is not limited to this and can be freely determined in accordance with the need. Since each pulse detector performs the same control without reference to the number of pulse detectors employed, the pulse detectors will be collectively referred to as pulse detector PTn in the descriptions below. Likewise, the data control circuits will be collectively referred to as data control circuit DTn in the descriptions below.

The following description will be made, on the assumption that the frequency of input pulses IN will rapidly change from high to low. In step 32, a check is made to see whether or not the time corresponding to the distance between the edges of successive input pulses IN is longer than time Tn which is set for the timer of pulse detector PTn. If the time corresponding to the edge-to-edge distance is longer than time Tn, the count of counter 13 becomes larger than the value corresponding to time Tn, and the flow advances to step 33. In step 33, a check is made to see whether or not the number of input pulses IN whose pulse widths correspond to time shorter than time Tn set for pulse detector PTn is larger than the predetermined number N. The reason why step 33 is included in the flowchart shown in FIG. 3 is that there may be a case where the number of edges of input pulses IN is smaller than the predetermined number N if the frequency of input pulses is low. If the number of input pulses IN is larger than the predetermined number and if time Tn elapses before the reception of another input pulse, then step 34 is executed. In step 34, data control circuit DTn supplies a control signal S1 to the pulse control circuit 12, and a latch signal EG is supplied to the latch circuit 14. Thereafter, step 35 is executed wherein the count of pulse detector PTn is cleared, and then the flow returns to step 31.

In the flowchart shown in FIG. 3, steps 36–39 and 40–42 are steps to be executed for a normal data output operation, and steps 43 and 44 are steps to be executed for coping with the occurrence of overflow.

Figure 1:
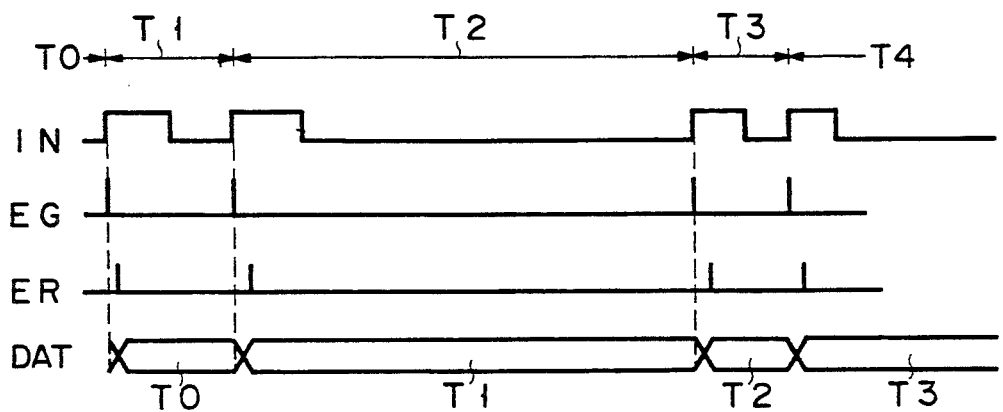
FIG. 1 is a timing chart showing how a conventional pulse position measurement type meter-driving apparatus controls output data.
Figure 4:
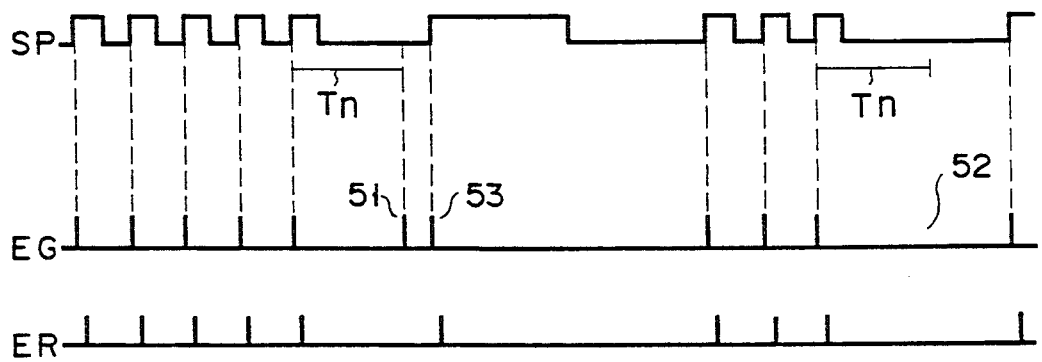
FIG. 4 is a timing chart showing the case where the circuit configuration in FIG. 1 is applied to the indicating needle control of the speedometer of an automobile.

FIG. 4 is a timing chart showing the case where the circuit configuration in FIG. 1 is applied to the indicating needle control of the speedometer of an automobile.

Referring to FIG. 4, a speed signal SP is entered as input pulse IN. If the edge-to-edge distance of the speed signal SP changes from short to long, this state is detected by pulse detector PTn, and a latch signal EG (indicated by 51 in FIG. 4) is output so as to latch the data obtained when the pulse position measurement counter 13 is still performing a counting operation. Thereafter, the next pulse edge is detected, and the counter 13 is reset by the a resetting signal ER.

The operation referred to in the preceding paragraph is an operation performed when a single pulse detector PTn (e.g., pulse detector 15 shown in FIG. 2) and a single data control circuit DTn (e.g., control circuit 18 shown in FIG. 2) are employed.

It should be noted that a speed sensor cannot be always installed at the intended position inside an automobile. Depending upon the position of the speed sensor, therefore, the pulse width of the speed signal generated by the speed sensor is likely to vary, and pulses may be irregularly input even if the automobile is traveling at a constant speed. In consideration of this, the flowchart shown in FIG. 3 is determined. That is, a latch signal EG (indicated by "52" in FIG. 4) is not generated until the number of successive input pulses of the speed signal SP becomes larger than the predetermined number (e.g., 3) even if those pulses are input after the lapse of time Tn set for the timer of the pulse detector PTn.

Figure 5:
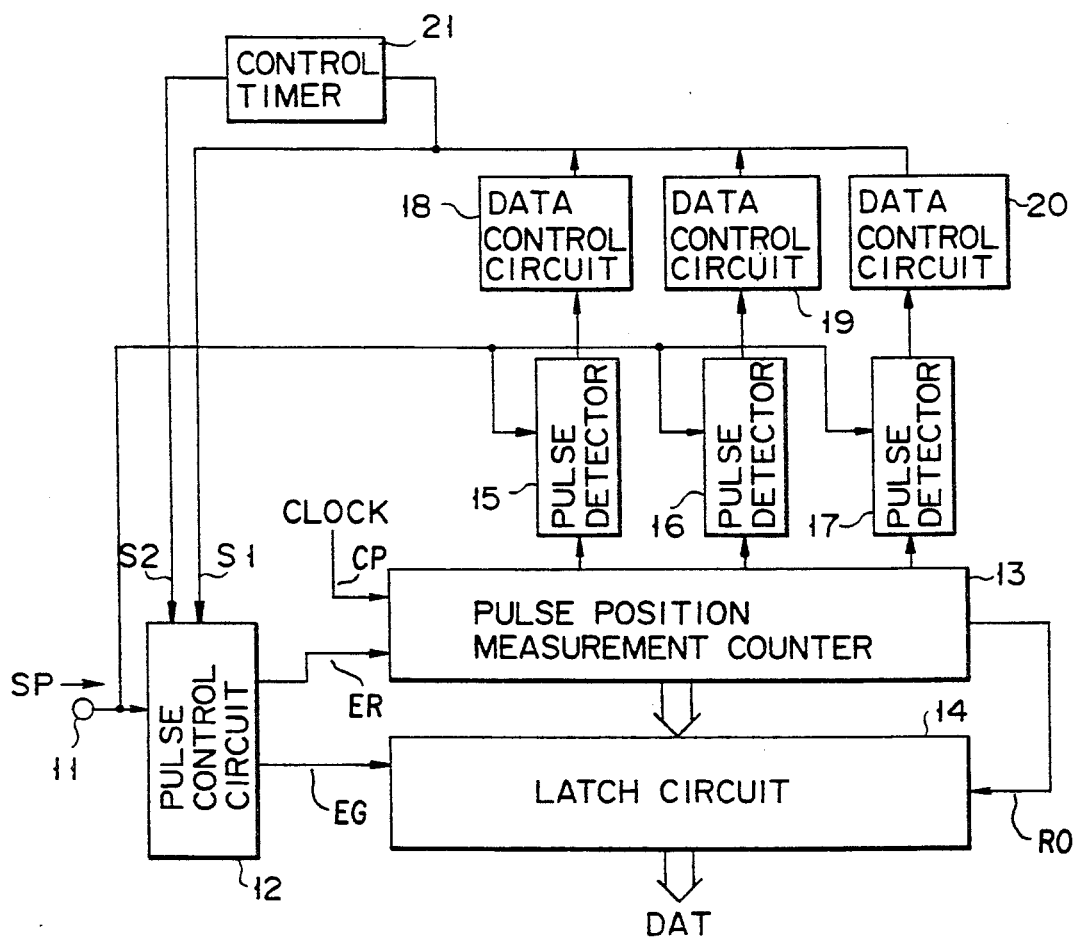
FIG. 5 is a diagram showing the circuit according to another embodiment of the present invention.

Further, it may happen that a pulse edge will be detected immediately after the interruption of latch signal 51 (indicated in FIG. 4). In this case, data will be latched in response to latch signal 53 (also indicated in FIG. 4). Since this latching of data is not necessary, a control timer 21 may be added to the circuit shown in FIG. 1, as is shown in FIG. 5. In the circuit configuration shown in FIG. 5, the control timer 21 prevents a latch signal from being output after the lapse of the predetermined time from the latch control operation performed by any one of the data control circuits 18, 19 and 20.

According to the circuit configurations shown in FIGS. 2 and 5, the angle shown by the indicating needle of a speedometer can be smoothly narrowed, as is indicated by the solid lines in FIG. 6, even when the distance between the edges of the pulses of the speed signal SP becomes long. According to the prior art, the angle shown by the indicating needle was narrowed in the manner indicated by the broken lines in FIG. 6, and the angle shown by the indicating needle does not always reflect actual measurement. In the present invention, however, the data associated with the angle shown by the indicating needle can be reduced smoothly before the detection of the edge of the next input pulse. Therefore, the angle shown by the indicating needle accurately reflects actual measurement.

According to the circuit configurations shown in FIGS. 2 and 5, moreover, the number of data latch operations performed during the counting operation by the pulse position measurement counter 13 can be restricted by means of the pulse detectors 18–20 and the data control circuits 15–17. Therefore, the circuit configurations shown in FIGS. 2 and 5 are suitable for application to an automobile's speedometer which is supplied with pulse signals having a frequency of more than 0 Hz and having discontinuous pulse widths.

As has been described above, in the present invention, a latch signal for interruption is output after the lapse of the predetermined time set for the timer. Therefore, data can be smoothly corrected before the detection of the edge of the next pulse. Accordingly, the present invention can provide a pulse position measurement type meter-driving circuit which ensures an accurate operation of a meter even if the pulse signal input to that meter is discontinuous.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A pulse position measurement type meter-driving apparatus, comprising:
    pulse position measuring means for generating both a latch signal and a resetting signal in response to edges of externally-input pulses and repeatedly measuring time corresponding to the distance between the edges to successive pulses;
    pulse number detecting means for detecting that the pulses have a width corresponding to a time shorter than a predetermined time and that the number of pulses which have been input exceeds a predetermined number;
    data control means for generating an interruption latch signal after the lapse of said predetermined time for the detection performed by the pulse number detecting means and when the pulse position measuring means which has not yet received a next pulse is operating; and
    pulse control means for repeatedly outputting measurement data with which to control display of a meter, in accordance with a time interval between the generation of the latch signal from the pulse-position measuring means and the generation of the interruption latch signal from the data control means and in accordance with the time measured by the pulse position measuring means.

2. A pulse position measurement type meter-driving apparatus according to claim 4, further comprising:
    latch control means for preventing the latch signal from being generated even if the pulse position measuring means detects a pulse edge within the predetermined time from the generation of the interruption latch signal from the data control means.

3. A pulse position measurement type meter-driving apparatus according to claim 2, wherein said latch control means includes a timer, and said latch signal is prevented from being generated even if the pulse position measuring means detects a pulse edge within a time which is set for the timer.

4. A pulse position measurement type meter-driving apparatus, comprising:
    a pulse control circuit for generating latch signals in response to edges of externally-input pulse and for generating a resetting signal after each of the latch signals is generated;
    a pulse position measurement counter for measuring a time interval between the generation of one latch signal and the generation of a successive latch signal, by counting reference clock signals;
    a latch circuit for latching the time interval measured by the pulse position measurement counter as output data in response to the latch signal;
    a pulse detector, having a timer function, for detecting that the time interval between successive latch signals is shorter than a predetermined time and that the number of latch signals which have been input is larger than a predetermined number; and
    a data control circuit for supplying a control signal to the pulse control circuit after the lapse of said predetermined time from the detection performed by the pulse detector, thereby interrupting a counting operation performed by the pulse position measurement counter before detection of a next latch signal.

5. A pulse position measurement type meter-driving apparatus according to claim 4, further comprising:
    a control timer for supplying a control signal to the pulse control circuit after the pulse control circuit supplies a latch signal to the latch circuit in response to the control signal supplied from the data control circuit, thereby preventing the latch signal from being generated from the latch circuit even if the pulse control circuit detects an edge of the input pulses within a predetermined time.

6. A pulse position measurement type meter-driving apparatus, comprising:
    a pulse control circuit for generating latch signals in response to edges of externally-input pulses and for generating a resetting signal after each of the latch signals is generated;

a pulse position measurement counter for measuring a time interval between the generation of successive latch signals, by counting reference clock signals;

a latch circuit for latching the time interval measured by the pulse position measurement counter as output data in response to the latch signal;

a plurality of pulse detectors, each having a timer function, for detecting that the time interval between successive latch signals is shorter than a predetermined time and that the number of latch signals which have been input is larger than a predetermined number; and a plurality of data control circuits for supplying a control signal to the pulse control circuit after the lapse of said predetermined time from the detection performed by each of the pulse detectors, thereby interrupting a counting operation performed by the pulse position measurement counter before detection of a next latch signal.

7. A pulse position measurement type meter-driving apparatus according to claim 6, further comprising:

a control timer for supplying a control signal to the pulse control circuit after the pulse control circuit supplied a latch signal to the latch circuit in response to the control signal supplied form each of the data control circuits thereby preventing the latch signal from being generated from the latch circuit even if the pulse control circuit detects an edge of the input pulses within a predetermined time.

* * * * *

UNITED STATES PATENT AND TRADEMARK OFFICE
CERTIFICATE OF CORRECTION

PATENT NO. : 5,138,639
DATED : August 11, 1992
INVENTOR(S) : Yoshihito Nakamura

It is certified that error appears in the above-identified patent and that said Letters Patent is hereby corrected as shown below:

Claim 1, column 6, line 3, change "for" to --from--.

Claim 2, column 6, line 16, change "claim 4" to --claim 1--.

Claim 4, column 6, line 32, before "and" change "pulse" to --pulses--.

Claim 7, column 8, line 9, change "supplied" to --supplies--.

Claim 7, column 8, line 10, change "form" to --from--.

Signed and Sealed this

First Day of February, 1994

Attest:

BRUCE LEHMAN

Attesting Officer    Commissioner of Patents and Trademarks